United States Patent [19]

Kuwamoto et al.

[11] Patent Number: 4,651,055

[45] Date of Patent: Mar. 17, 1987

[54] FLUORESCENT DISPLAY DEVICE HAVING POLYGON SHAPED ELECTRODE ENDS

[75] Inventors: Michio Kuwamoto; Masahiro Takahashi; Masafumi Hasegawa, all of Mobara, Japan

[73] Assignee: Futaba Denshi Kogyo Kabushiki Kaisha, Mobara, Japan

[21] Appl. No.: 699,122

[22] Filed: Feb. 7, 1985

[30] Foreign Application Priority Data

Feb. 13, 1984 [JP] Japan ................................ 59-17512

[51] Int. Cl.[4] ........................ H01J 61/36; H05K 1/00

[52] U.S. Cl. .................................... 313/496; 313/318; 339/17 CF

[58] Field of Search ................................ 313/495–497, 313/331, 318, 517, 583; 174/52 FP; 361/421; 357/68, 70; 339/17 CF, 17 LM, 278 C

[56] References Cited

U.S. PATENT DOCUMENTS

| | | | |
|---|---|---|---|
| 4,047,066 | 9/1977 | Kobayakawa et al. | 313/496 X |
| 4,100,385 | 7/1978 | Wutz | 339/278 C X |
| 4,220,894 | 9/1980 | Kobayakawa et al. | 313/496 |

*Primary Examiner*—Palmer C. DeMeo
*Assistant Examiner*—Sandra L. O'Shea
*Attorney, Agent, or Firm*—Oblon, Fisher, Spivak, McClelland & Maier

[57] ABSTRACT

A fluorescent display device which is capable of eliminating a soldering failure such as a tunnel solder phenomenon is disclosed. The fluorescent display device includes electrode wires each having an external lead portion which has a convex polygonal shape in section to allow a chromium oxide layer to be readily removed by a mechanical method, to thereby effectively carry out the mounting a fluorescent display device on a substrate by soldering.

7 Claims, 18 Drawing Figures

FLUORESCENT DISPLAY DEVICE HAVING POLYGON SHAPED ELECTRODE ENDS

BACKGROUND OF THE INVENTION

1. Field of the Invention

This invention relates to a fluorescent display device, and more particularly to a lead for an electrode in a fluorescent display device which is capable of being positively mounted on a substrate by soldering.

2. Description of the Prior Art

Typically, a lead frame of a fluorescent display device is made of 426 alloy an alloy of 42% nickel, 6% chromium with the remainder being iron) which has substantially the same coefficient of thermal expansion as that of frit glass used for hermetically sealing a casing on a substrate and good conformability with the frit glass, and formed into such a complicated shape as indicated by reference characters LF in FIG. 1 by etching a plate of 426 alloy. The lead frame thus formed is then subjected to an oxidation treatment to form a layer of chromium oxide ($Cr_2O_3$: chromium dioxide) thereon. The chromium oxide layer has good conformability with frit glass, which is adhesive and is used as a pigment for glass as well. Thus, the layer may improve adhesion between the lead frame and the sealing portion of the casing, to thereby provide satisfied airtightness.

The lead frame, as shown in FIG. 1, serves to hold control electrodes G provided as desired and is connected to electrodes such as anodes, cathodes, control electrodes and the like to act as lead for the electrodes. However, the external lead portion of the electrode lead does not materially have good conformability with solder, because it is made of 426 alloy. Accordingly, it is highly difficult to mount a fluorescent display device through the external lead on a substrate by soldering. Such a defect is aggravated when the chromium oxide layer is formed on the surface of the lead. In order to avoid such a disadvantage, it is required to carry out solder coating obtained by previously applying solder to the external lead portion from which the chromium oxide layer has been peeled.

The removal of the chromium oxide layer is carried out by a mechanical method using a brush or the like or a chemical method. The mechanical method is exclusively used, because the chemical method has an important defect that it is highly troublesome and difficult to treat a waste liquid containing Cr.

Further, the height or thickness of the external lead portion of the electrode lead is apt to be large. More particularly, the diversification of display function of a fluorescent display device increases the number of leads and each of the lead is obliged to have a reduced width. This results in the thickness of the lead wire being necessarily increased in order to ensure the strength and reliability. Also, as shown in FIGS. 2(A)–(E), it is generally required that etching of the lead frame using a resist R to form the external lead portion is excessively carried out in light of the control of dimensions of the extenal lead portion so that both side surfaces of the external lead portion each may have a concave shape, because a failure in the control of width l of the external lead portion causes the contact between the external lead portions of the adjacent leads. This renders the removal of the chromium oxide layer from the concave side surfaces of the external lead portion by a mechanical method using a brush or the like substantially impossible, since the brush or the like fails to evenly contact with the concave side surfaces.

Such failure in removal of the chromium oxide layer, as shown in FIG. 3, hinders the application of solder coating onto the side surfaces of the external lead portion. Accordingly, the bonding between the side surfaces of the external lead portion and a substrate PC may not be carried out during the mounting of a fluorescent display device on the substrate PC by soldering, as shown in FIG. 4, resulting in soldering failure which is known as a tunnel solder phenomenon. This causes an important disadvantage that the bonding between the external lead portion and the substrate is made with weak bond strength and a small bond area, to thereby often incur the electrical contact failure therebetween and fail in the mounting of a fluorescent display device on the substrate with good reliability.

SUMMARY OF THE INVENTION

The present invention has been made in view of the foregoing disadvantage of the prior art.

Accordingly, it is an object of the present invention to provide a fluorescent display device which is capable of eliminating a soldering failure in the mounting of the fluorescent display device onto a substrate.

It is another object of the present invention to provide a fluorescent display device which is capable of being mounted onto a substrate by soldering with good reliability.

In accordance with the present invention, there is provided a fluorescent display device comprising an anode substrate having an anode arranged thereon, electrodes arranged opposite to the anodes which include cathodes and the like, a casing for hermetically encapsulating the electrodes therein, electrode leads extending through the sealing portion between the anode substrate and the casing. The electrode leads each has an external lead portion outward led out through said sealing portion. At least the external lead portion of each of the electrode leads is formed into a convex polygonal, that is a polygon with at least one bulging outward side shape in section in which the upper and lower surfaces are parallel with said anode substrate and opposite to each other and the side surfaces connecting said upper and lower surfaces are oblique at least at a part thereof.

BRIEF DESCRIPTION OF THE DRAWINGS

These and other objects and many of the attendant advantages of the present invention will be readily appreciated as the same becomes better understood by reference to the following detailed description when considered in connection with the accompanying drawings in which like reference characters designate like or corresponding parts throughout, wherein.

DETAILED DESCRIPTION OF THE PREFERRED EMBODIMENT

Now, a fluorescent display device according to the present invention will be described with reference to the accompanying drawings.

Figure 1:
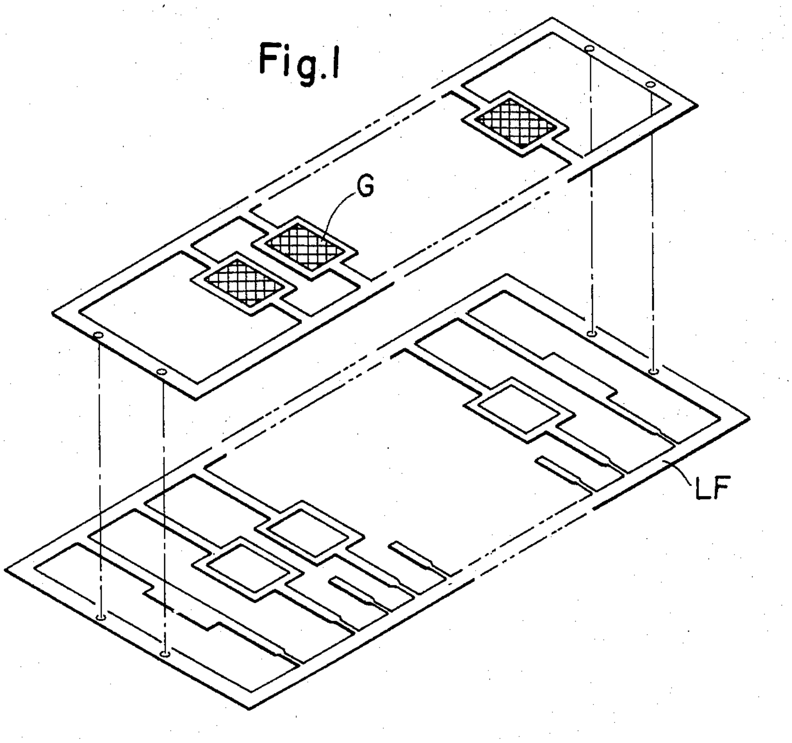
FIG. 1 is a schematic perspective view showing the configuration of a lead frame.
Figures 2A, 2B, 2C, 2D, 2E, 2F:
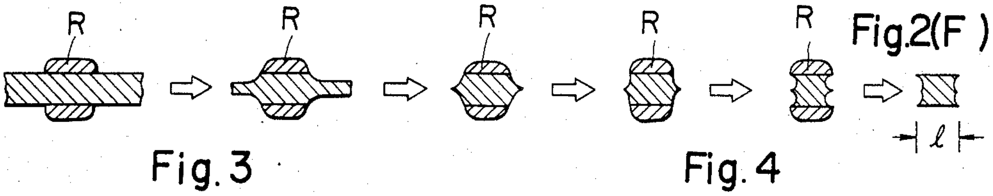
FIGS. 2(A)–(F) are schematic views showing the procedure for forming an electrode lead of a lead frame by etching.
Figure 3:
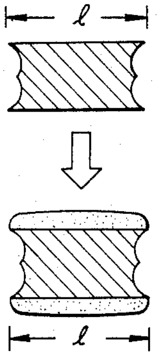
FIG. 3 is a schematic vertical view showing a conventional electrode lead having solder coating formed thereon.
Figure 4:
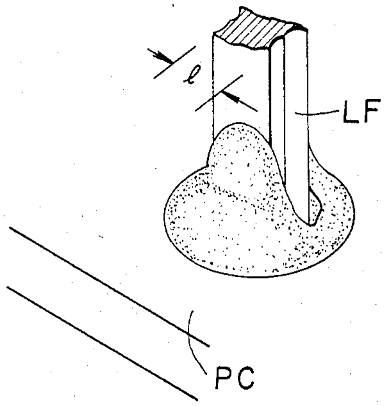
FIG. 4 is a schematic perspective view showing a tunnel solder phenomenon.
Figure 5:
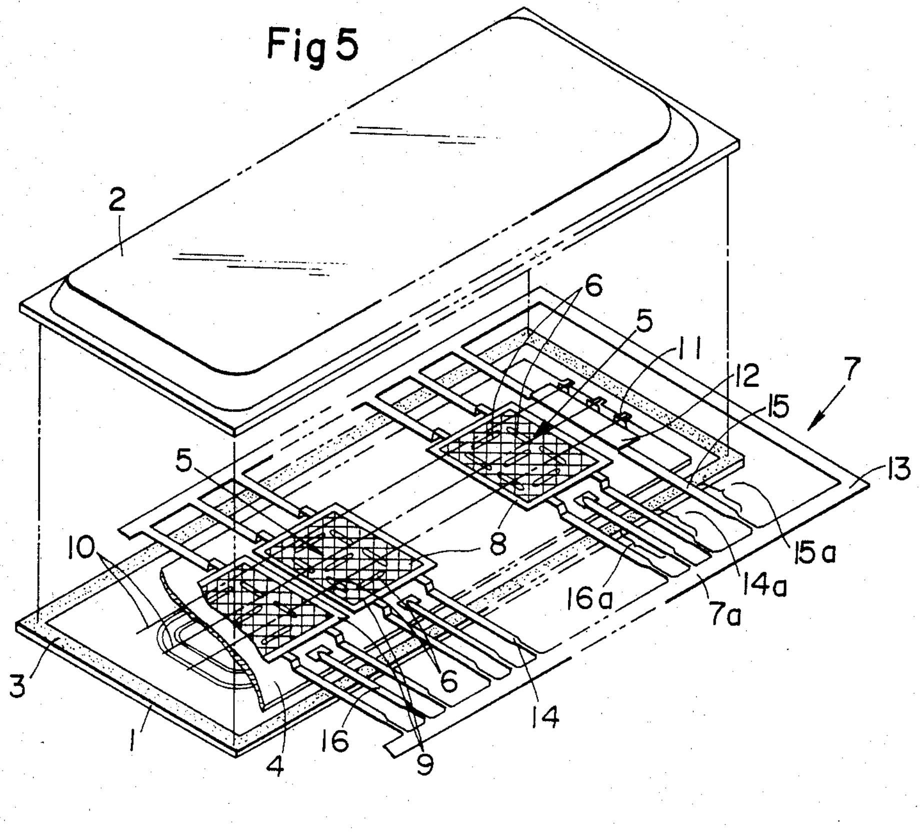
FIG. 5 is an exploded perspective view showing an embodiment of a fluorescent display device according to the present invention.

FIG. 5 shows an embodiment of a fluorescent display device according to the present invention. The fluorescent display device of the illustrated embodiment includes an anode substrate 1 made of an insulating material, for example, such as glass or the like, and a casing 2 hermetically sealed on the anode substrate 1 by means of a sealant or adhesive 3, such as, for example, frit glass or the like to form an envelope in cooperation with the substrate 1.

The envelope constructed by the casing 2 and anode substrate 1 is evacuated through an evacuation pipe (not shown) provided at a position to be kept at high vacuum. In the illustrated embodiment, the casing 2 is formed of transparent glass to allow luminous display on the anode substrate 1 to be observed through the casing 2.

The anode substrate 1 has an anode 4 arranged on the inner surface thereof. On the anode 4 are arranged a plurality of anode conductors 5 each constituting a suitable display pattern such as an 8 figure. The anode conductors 5 each have a phosphor layer 6 deposited thereon.

Figure 6:
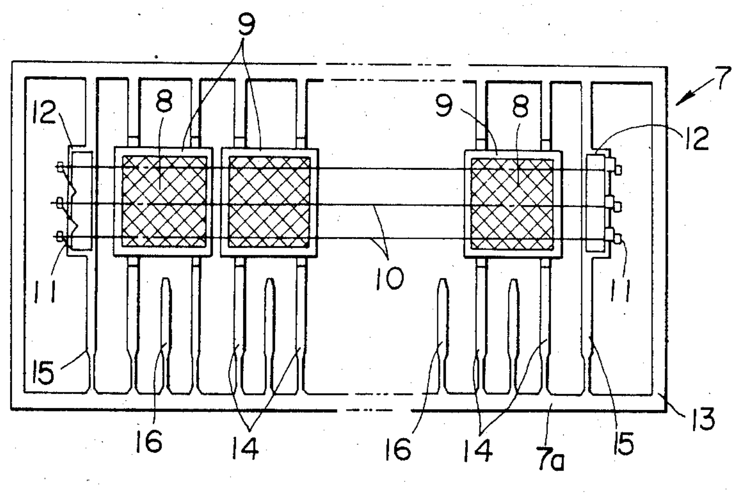
FIG. 6 is a schematic plan view showing the configuration of a lead frame in the fluorescent display device of FIG. 5.

Reference numeral 7 designates a lead frame, which has a complicated shape as shown in FIG. 6 and may be formed of, for example, a sheet of 426 alloy by etching. The lead frame 7 has a chromium oxide layer *7a* formed on at least the portion of the surface thereof contacting with the sealant 3, which has a coefficient of thermal expansion substantially equal to those of the casing 2 and anode substrate 1 and good conformability and wettability with the sealant 3. In the illustrated embodiment, the lead frame 7 comprises a plurality of control electrode holding frame sections 9 for holding mesh-like control electrodes 8 thereon, anode holding frame sections 12 for securely holding a pair of cathode stretching members 11 which act to stretchingly support filamentary cathodes 10 thereon, an outer frame section 13 which is adapted to be removed upon completion of a fluorescent display device, electrode leads 14 for the control electrodes 8, electrode lead 15 for the cathodes 10, and electrode lead 16 electrically connected with the respective anode conductors 5 arranged on the anode 4.

Figure 7:
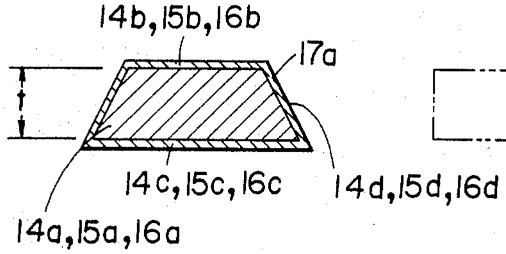
FIG. 7 is a schematic view showing the sectional configuration of the external lead portion of an electrode lead used in the fluorescent display device of FIG. 5.

The respective electrode leads 14, 15 and 16 are hermetically or airtightly led out through the sealing portion between the anode substrate 1 and the casing 2, and at least the external lead portions 14*a*, 15*a* and 16*a* of the electrode leads 14, 15 and 16 led out from the sealing portion each have a sectional configuration as shown in FIG. 7. More particularly, in the illustrated embodiment, the external lead portions each are formed into a trapezoid-like shape in section so that the upper surfaces 14*b*, 15*b* and 16*b* and lower surfaces 14*c*, 15*c* and 16*c* thereof may be substantially in parallel with the anode substrate 1 and opposite to one another and that the side surfaces 14*d*, 15*d* and 16*d* connecting the upper and lower surfaces may be oblique.

Figure 8:
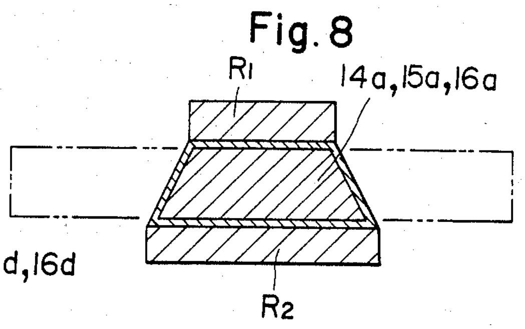
FIG. 8 is a schematic view showing the formation of the external lead portion of an electrode lead having such a sectional configuration as shown in FIG. 7.

The formation of each of the external lead portions 14*a*, 15*a* and 16*a* having the above-described sectional configuration is readily accomplished by respectively depositedly forming resists $R_1$ and $R_2$ on the upper surface 14*b*, 15*b* or 16*b* and the lower surface 14*c*, 15*c* or 16*c* so that the resists $R_1$ and $R_2$ may have widths different from each other as shown in FIG. 8 and then subjecting the external lead portion to etching.

The formation of each of the external lead portions 14*a*, 15*a* and 16*a* into a convex polygonal shape as described above allows a brush to be effectively given to the oblique side surfaces 14*d*, 15*d* and 16*d* as well as the upper and lower surfaces irrespective of a thickness t of the external lead portions when the brushing is carried out on the upper and lower surfaces, to thereby effectively remove not only the chromium oxide layers *7a* on the upper and lower surfaces 14*b*-16*b* and 14*c*-16*c* but those on the oblique side surfaces 14*d*, 15*d* and 16*d*. This allows solder coating to be effectively applied onto the oblique side surfaces 14*d*, 15*d* and 16*d*, so that the external lead portions 14*a*, 15*a* and 16*a* may be readily and positively fixed on the substrate by soldering without generating a soldering failure called a tunnel solder phenomenon as in the prior art.

Figure 9A:
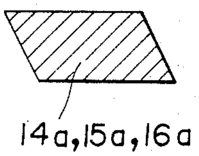
FIGS. 9(A)-(E) each are a schematic view showing another sectional configuration of the external lead portion of an electrode lead.
Figure 9B:
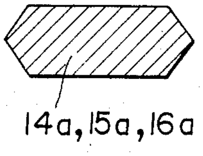
Figure 9C:
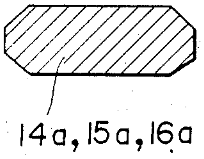
Figure 9D:
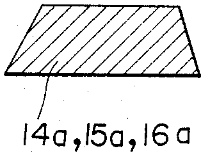
Figure 9E:
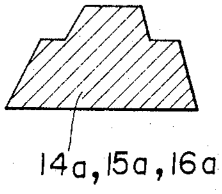

In the embodiment described above, the external lead portions 14*a*, 15*a* and 16*a* each are formed into an isosceles trapozoid in section. Alternatively, the external lead portion may have any other convex polygonal shape in section, for example, as shown in FIG. 9. More specifically, FIG. 9(A) shows a parallelogram, FIG. 9(B) shows a hexagon, FIG. 9(C) shows an octangle, FIG. 9(D) shows a trapezoid, and FIG. 9(E) shows a substantially convex shape.

An experiment was carried out for studying an improvement in solderability of the external lead portions 14*a*, 15*a* and 16*a* in the fluorescent display device of the present invention. The results are shown in the following table.

| Sectional Configuration | Ratio of Ejection P of Side Surface to Width M of External Lead Portion (%) | Rate of Occurrence of Tunnel Solder Phenomenon (%) |
|---|---|---|
| Prior Art | | |
| 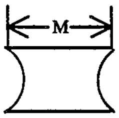  | 0 | 4.0 |
| Present Invention | | |

-continued

| Sectional Configuration | Ratio of Ejection P of Side Surface to Width M of External Lead Portion (%) | Rate of Occurrence of Tunnel Solder Phenomenon (%) |
|---|---|---|
| 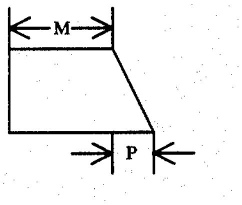 | 15-17 | 0.50 |
| 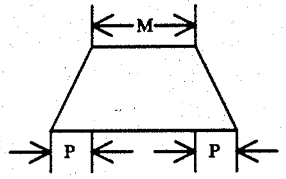 | 30-35<br>50-60 | 0.20<br>≈0 |

From the above table, it will be noted that the formation of the external lead portion into a convex polygonal shape having a convex side surface significantly decreases or substantially prevent the occurrence of the tunnel solder phenomenon.

As can be seen from the foregoing, the present invention is constructed in the manner that the electrode leads each are formed at least at the external lead portion thereof hermetically led out through the sealing portion between the anode substrate and the casing into a convex polygonal shape in section in which at least a portion of the side surfaces has an oblique line. Therefore, the mounting of the fluorescent display device on the substrate may be effectively positively carried out without any soldering failure with respect to the substrate including the tunnel solder phenomenon.

While a preferred embodiment of the invention has been described with a certain degree of particularity, obvious modifications and variations are possible in light of the above teachings. It is therefore to be understood that within the scope of the appended claims, the invention may be practiced otherwise than as specifically described.

What is claimed as new and desired to be secured by Letters Patent of the United States is:

1. A fluorescent display device comprising:
a substrate;
an anode arranged on said substrate;
a cathode arranged opposite to said anodes;
a casing for hermetically encapsulating said anode and cathode therein;
electrode leads extending through the sealing portion between said substrate and said casing, said electrode leads each having an external lead portion outward led out through said sealing portion; and
at least said external lead portion of each of said electrode leads being formed as a polygon with at least one bulging outward side in section, in which the upper and lower surfaces of said electrode leads are parallel with said substrate and opposite to each other and the side surfaces connecting said upper and lower surfaces are oblique at least at a part thereof.

2. The fluorescent display device as defined in claim 1, wherein said electrode leads each are formed of a 426 alloy and have a layer of chromium oxide formed on the portion of the surface thereof contacting with said sealing portion.

3. The fluorescent display device as defined in claim 1, wherein said external lead portions of said electrode leads have solder coating applied thereon.

4. A fluorescent display device comprising:
a substrate;
an anode arranged on said substrate;
a cathode arranged opposite to said anodes;
a casing for hermetically encapsulating said anode and cathode therein;
electrode leads extending through the sealing portion between said substrate and said casing, said electrode leads each having an external lead portion outward led out through said sealing portion; and
at least said external lead portion of each of said electrode leads being formed as a parallelogram having two angles thereof greater than 90° in section, in which the upper and lower surfaces of said electrode leads are parallel with said substrate and opposite to each other and the side surfaces connecting said upper and lower surfaces are oblique at least at a part thereof.

5. A fluorescent display device comprising:
a substrate;
an anode arranged on said substrate;
a cathode arranged opposite to said anodes;
a casing for hermetically encapsulating said anode and cathode therein;
electrode leads extending through the sealing portion between said substrate and said casing, said electrode leads each having an external lead portion outward led out through said sealing portion; and
at least said external lead portion of each of said electrode leads being formed as a hexagon in section, in which the upper and lower surfaces of said electrode leads are parallel with said substrate and opposite to each other and the side surfaces connecting said upper and lower surfaces are oblique at least at a part thereof.

6. A fluorescent display device comprising:
a substrate;
an anode arranged on said substrate;
a cathode arranged opposite to said anodes;
a casing for hermetically encapsulating said anode and cathode therein;
electrode leads extending through the sealing portion between said substrate and said casing, said electrode leads each having an external lead portion outward led out through said sealing portion; and
at least said external lead portion of each of said electrode leads being formed as an octagon in section, in which the upper and lower surfaces of said electrode leads are parallel with said substrate and opposite to each other and the side surfaces connecting said upper and lower surfaces are oblique at least at a part thereof.

7. A fluorescent display device comprising:
a substrate;
an anode arranged on said substrate;
a cathode arranged opposite to said anodes;
a casing for hermetically encapsulating said anode and cathode therein;
electrode leads extending through the sealing portion between said substrate and said casing, said electrode leads each having an external lead portion outward led out through said sealing portion; and at least said external lead portion of each of said electrode leads being formed as a trapezoid in section, in which the upper and lower surfaces of said electrode leads are parallel with said substrate and opposite to each other and the side surfaces connecting said upper and lower surfaces are oblique at least at a part thereof.

* * * * *